United States Patent
Chae et al.

(10) Patent No.: US 7,539,826 B2
(45) Date of Patent: May 26, 2009

(54) SYSTEM, DEVICE, AND METHOD FOR IMPROVED MIRROR MODE OPERATION OF A SEMICONDUCTOR MEMORY DEVICE

(75) Inventors: Moo-Sung Chae, Seoul (KR); Kye-Hyun Kyung, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 361 days.

(21) Appl. No.: 11/117,804

(22) Filed: Apr. 29, 2005

(65) Prior Publication Data
US 2005/0262318 A1 Nov. 24, 2005

(30) Foreign Application Priority Data
May 20, 2004 (KR) .................. 10-2004-0036148

(51) Int. Cl.
*G06F 12/16* (2006.01)
(52) U.S. Cl. .................................... 711/162
(58) Field of Classification Search ........... None
See application file for complete search history.

(56) References Cited

U.S. PATENT DOCUMENTS

| 6,417,718 B1 * | 7/2002 | Ota ........................... 327/407 |
| 6,480,946 B1 * | 11/2002 | Tomishima et al. ......... 711/167 |
| 6,667,895 B2 | 12/2003 | Jang et al. |
| 2003/0038350 A1 | 2/2003 | Hirose |
| 2004/0130952 A1 | 7/2004 | Ryu et al. |

FOREIGN PATENT DOCUMENTS

| KR | 2000-0067412 | 11/2000 |
| KR | 2000-0073345 | 12/2000 |
| KR | 10-2004-0034171 | 4/2004 |

\* cited by examiner

*Primary Examiner*—Reginald G Bragdon
*Assistant Examiner*—Eric Loonan
(74) *Attorney, Agent, or Firm*—Marger Johnson & McCollom, P.C.

(57) ABSTRACT

By using the combination of a pre-existing command signal that is common to two memory devices and a non-shared command signal that is applied individually to each of the devices, embodiments of the invention may operate in a mirror mode, thereby preventing unwanted signal degradation due to stub loads. Because embodiments of the invention do not require additional dedicated pins and/or pads compared to the conventional art, it is possible to achieve mirror mode operation in a smaller device package.

20 Claims, 14 Drawing Sheets

SYSTEM, DEVICE, AND METHOD FOR IMPROVED MIRROR MODE OPERATION OF A SEMICONDUCTOR MEMORY DEVICE

CROSS REFERENCE TO RELATED APPLICATIONS

This application claims priority from Korean Patent Application No. P2004-36148, filed on 20 May 2004, the content of which is hereby incorporated by reference in its entirety for all purposes.

BACKGROUND OF THE INVENTION

1. Field of the Invention

This disclosure relates generally to the field of semiconductor devices, and more particularly, to improved mirror mode operation of semiconductor memory devices.

2. Description of the Related Art

FIG. 1 is a block diagram illustrating a conventional memory system 100 having several memory modules. The memory system 100 includes two memory modules 105, 110. Each memory module 105, 110 includes several dynamic random access memory (DRAM) devices 120 and a control/address (C/A) buffer 125. The DRAM devices 120 and the C/A buffer 125 are mounted on a module board. The DRAM devices 120 and C/A buffers on each of the memory modules 105, 110 receive signals transferred from a controller 115 through a socket/connector (not shown) mounted on the mother board/module board. A data (DQ) bus and a clock (CLK) bus on the motherboard are commonly connected with the DRAM devices 120 on each of the memory modules 105, 110. The DRAM devices 120 are stub loads for the DQ and CLK busses, thus the configuration illustrated in FIG. 1 is sometimes referred to as a "stub-bus" configuration. Although only one side of the memory modules 105, 110 are illustrated in FIG. 1, there may be other DRAM devices 120 and/or C/A buffers 125 mounted on the other side. In this case the memory modules 105, 110 are commonly known as Dual Inline Memory Modules (DIMMs).

FIG. 2 is a schematic diagram illustrating two integrated circuits in a conventional mirrored pair arrangement. The external signals that are applied to the bonding pads of the device 310 are symmetrical to those applied to the bonding pads of the device 320. Depending on the selection logic SEL that is applied to the MUX 315, 325 of each of the integrated circuits, appropriate internal switching configurations may be established. For example, as shown in FIG. 2, the signals A2, A10, /RAS, CK, /CK, /CS, A9, and A5 may be assigned to pads 340, 345, 350, 355, 360, 365, 370, 375 of the normal device 310. The mirrored device 320, on the other hand, may have the signals A5, A9, /CS, /CK, CK, /RAS, A10, and A2 assigned to respective pads 340-375.

FIG. 3 is a schematic diagram illustrating a memory controller coupled to a normal package and to a mirrored package that are in a paired configuration according to the conventional art. The memory controller 400 generates exemplary signals A, ..., B, DQ1, ..., DQ7. Mirrored package 410 is arranged "back-to-back" with normal package 420 as was described above in FIG. 2, thus adjacent pins of the packages 410, 420 may be tied together as indicated in FIG. 3. In the normal package 420, the pins for A, B, DQ1, and DQ7 signals are assigned to receive the signals A, B, DQ1, and DQ7, respectively. Herein, the pins for A, B, DQ1, and DQ7 signals are respectively connected to the corresponding pads for A, B, DQ1, and DQ7 signals which is located in the devices 410, 420 (not shown). However, in the mirrored package 410, the pins for A, B, DQ1, and DQ7 signals are assigned to receive the signals B, A, DQ7, and DQ1, respectively.

FIG. 4 is a schematic diagram illustrating the pin arrangement of a conventional DIMM having a number of memory devices mounted on the module board. There are a number of memory devices 10-1, 10-2, ..., 10-n mounted on the front side 10 of the memory module. There are also a number of memory devices 20-1, 20-2, ..., 20-n mounted on a rear side 20 of the memory module.

Each memory device 10-1, ... 10-n, 20-1, ..., 20-n, receives common power signals (power), common command signals (com), common address signals (add), non-shared command signals (ncom1, ncom2,), and common data signals (data) from a memory controller. Generally, power signals may include a power supply signal (VCC) or a ground potential signal (VSS). The command signals (com) may include a number of signals such as a clock signal (CK) a row address strobe signal (RASB), a column address signal (CASB), a write enable signal (WEB), a clock enable signal (CKE), etc.

Furthermore, each of the memory devices 10-1, ..., 10-n on the front side 10 of the memory module receives a "non-shared" command signal ncom2. Similarly, each of the memory devices 20-1, ..., 20-n on the rear side 20 of the memory module receives a "non-shared" command signal ncom1. In other words, the non-shared command signal ncom1 is commonly applied to all memory devices on the rear side 20 of the memory module and the non-shared command signal ncom2 is commonly applied to all memory devices on the front side 10 of the memory module. For purposes of this disclosure, the term "non-shared" is interpreted in its broadest sense to describe any signal that is not commonly shared among all the memory devices on the memory module.

The power signal (power) pins, command signal (corn) pins, address signal pins (add), and data signal pins (data) are commonly connected to all memory devices mounted on the module board. However, since each of the memory devices is configured in a normal pin arrangement, the pin arrangement on the front side 10 if the memory module is asymmetrically arranged compared to the pin arrangement on the rear side 20 of the memory module. Because of this, the shared signal lines (power, corn, add, data) must be separated on the module board.

For example, the number 1 pin of memory device 10-1 and the number 1 pin of memory device 20-1 are not located directly adjacent to the other, rather each is offset to the right or left with respect to the other. Consequently, the signal lines must be separated in order to supply the signal to both of the pins. One of the signal leads will necessarily be shorter than the other, which results in a "short stub" load that may cause unwanted reflections and degrade signal quality, especially at high frequency operation.

FIG. 5 is a schematic diagram illustrating a conventional memory device 600 capable of a mirror mode function. The device 600 receives a number of external signals such as power signals (VCC, VREF, GND), non-shared command signals (NCOM), command signals (COM), address signals (ADD), and data signals (DATA) at external pins. The external signals mentioned above appear at corresponding pads PVCC, PVREF, PGND, PNCOM, PCOM, PADD, and PDATA.

The memory device 600 operates in normal mode or mirror mode depending on the signals that are applied to the switching circuit 610. When the switching circuit 610 is connected to the power supply source pad PVCC via the bonding option pad 600-1, the memory device 600 operates in mirror mode. That is, the switching circuit 610 switches an arrangement of input signals inputted from variable external terminals to a different type arrangement. For example, the input signals applied to the command and address pads (PNCOM, PCOM, and PADD) are respectively transferred to a corresponding number of internal data signals (idata) rather than a corresponding number of internal command and address signals (income, icom, iadd).

On the other hand, when the switching circuit 610 is connected to the ground potential signal (PGND) pad through the bonding option pad 600-2, the memory device operates in normal mode. That is, the input signals of the command and address pads (PNCOM, PCOM, and PADD) are respectively transferred to internal command signals (income, icom) and internal address signals (iadd) without translation to other internal signals. In normal mode, the input signals of the data signal pads (PDATA) are also respectively transferred to a number of corresponding internal data signals (idata).

In order to operate the conventional memory device 600 in mirror or normal mode as described above, it is frequently necessary to increase the size of the device to accommodate additional bonding option pads (such as 600-1, 600-2) or pins. This translates into an increased manufacturing cost.

Embodiments of the invention address these and other disadvantages of the conventional art.

DETAILED DESCRIPTION OF THE INVENTION

Figure 6:
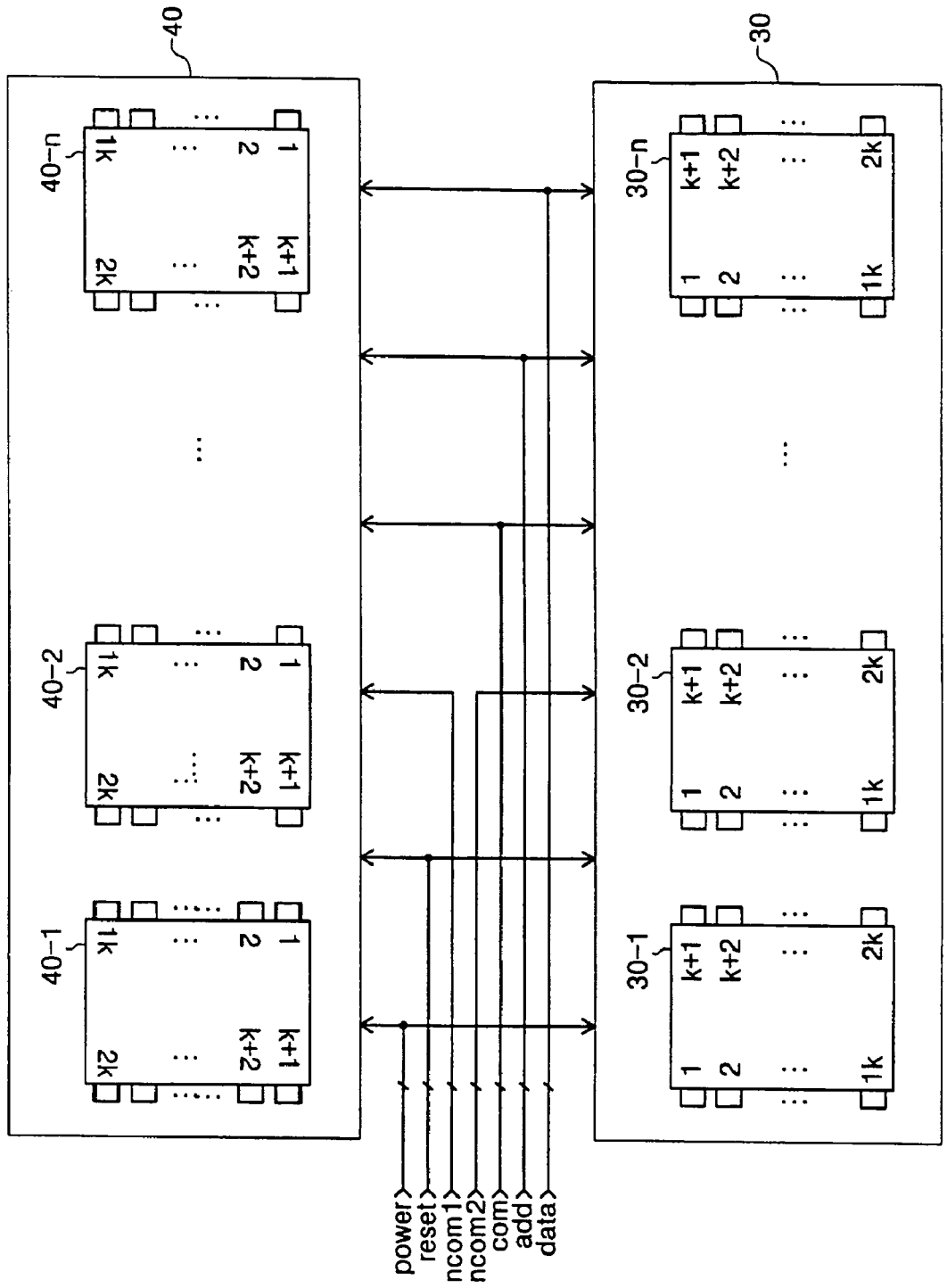
FIG. 6 is a schematic diagram illustrating the pin arrangement of a DIMM according to some embodiments of the invention.

FIG. 6 is a schematic diagram illustrating a pin arrangement for a DIMM that is compatible with embodiments of the invention. The DIMM includes a number of memory devices 30-1, . . . 30-n mounted to a front side 30 of a module board and a number of memory devices 40-1, . . . 40-n mounted to a back side 40 of a module board.

Figure 1:
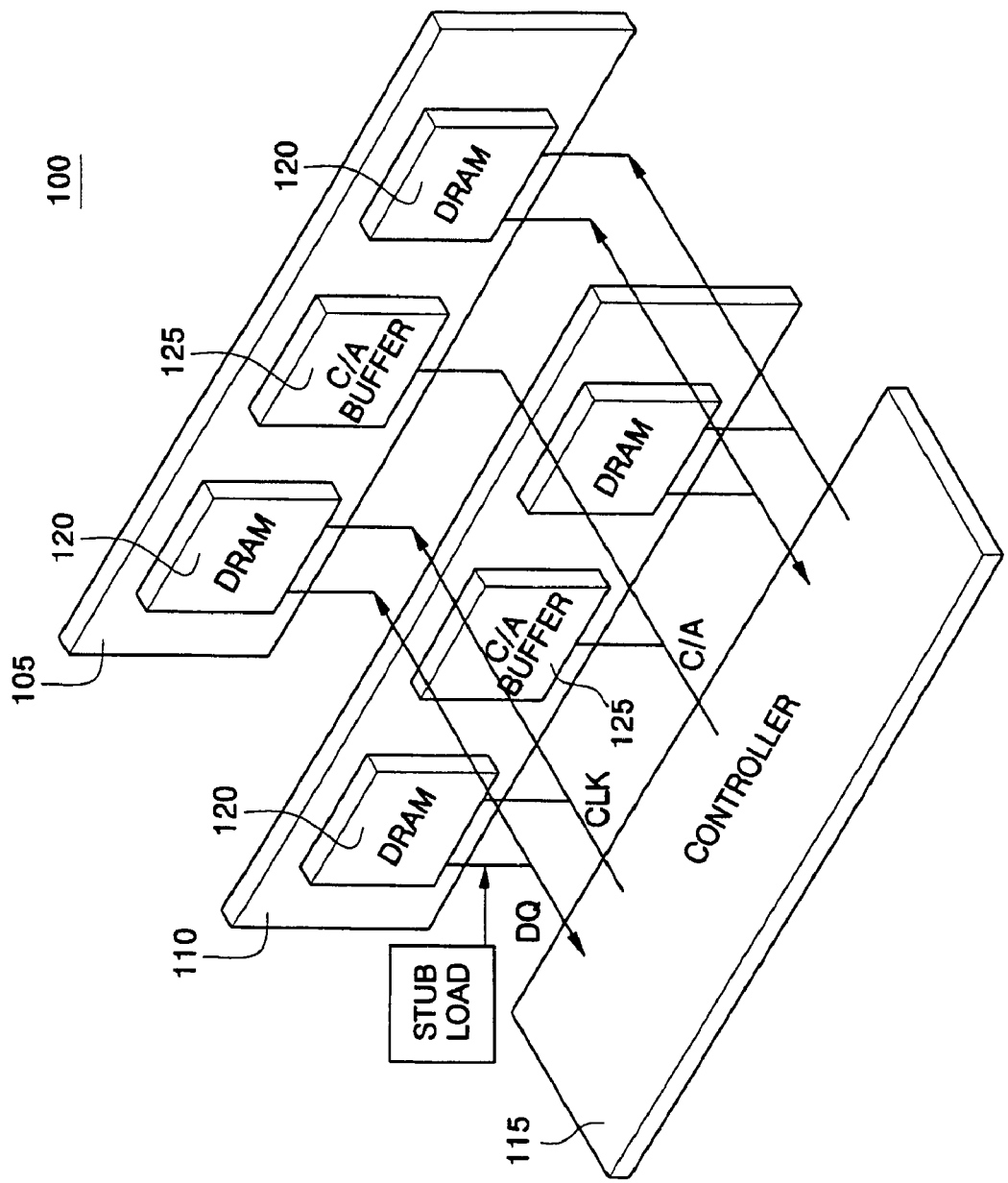
FIG. 1 is a block diagram illustrating a conventional memory system having several memory modules.
Figure 2:
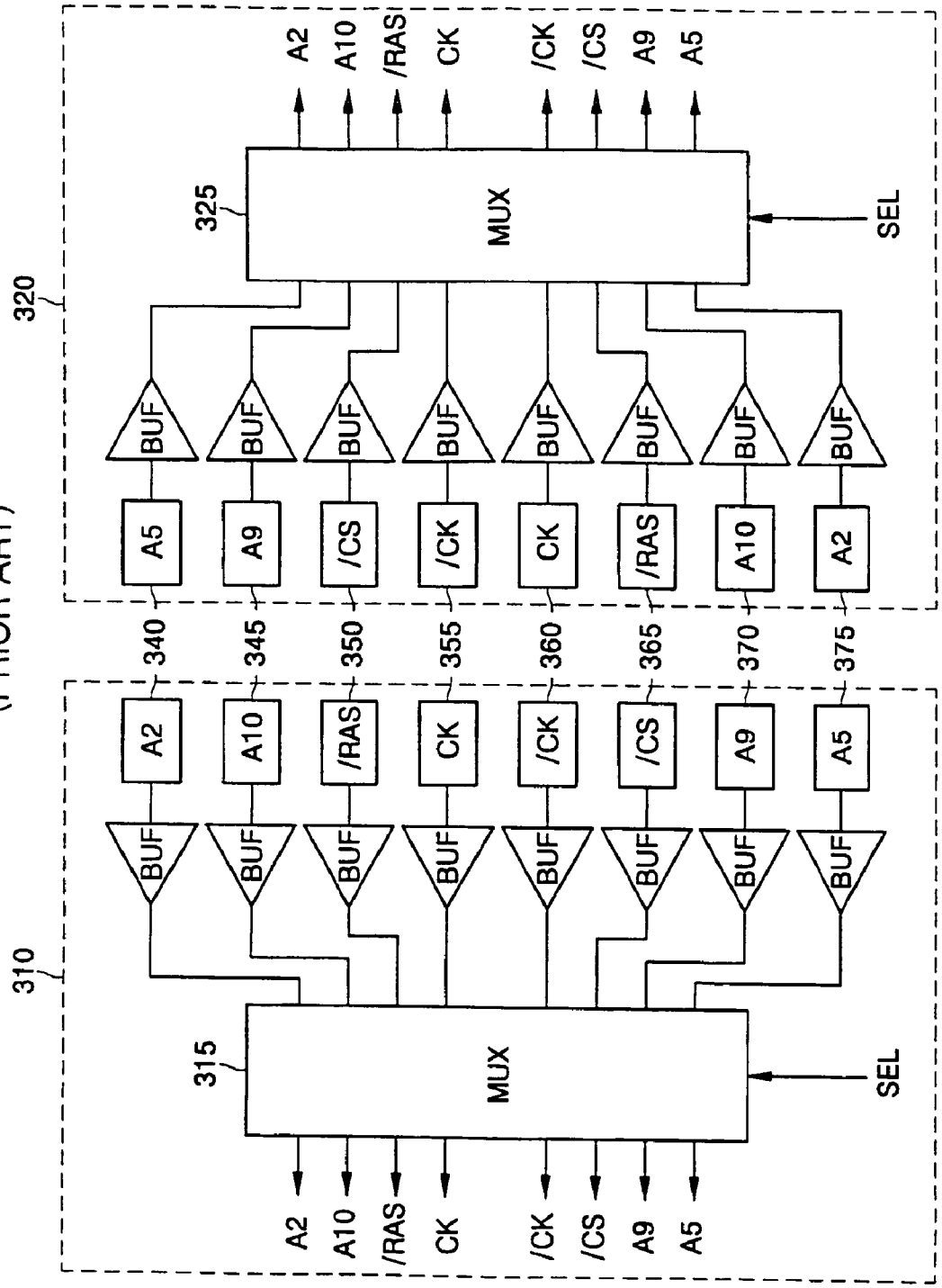
FIG. 2 is a schematic diagram illustrating two integrated circuits in a conventional mirrored pair arrangement.
Figure 3:
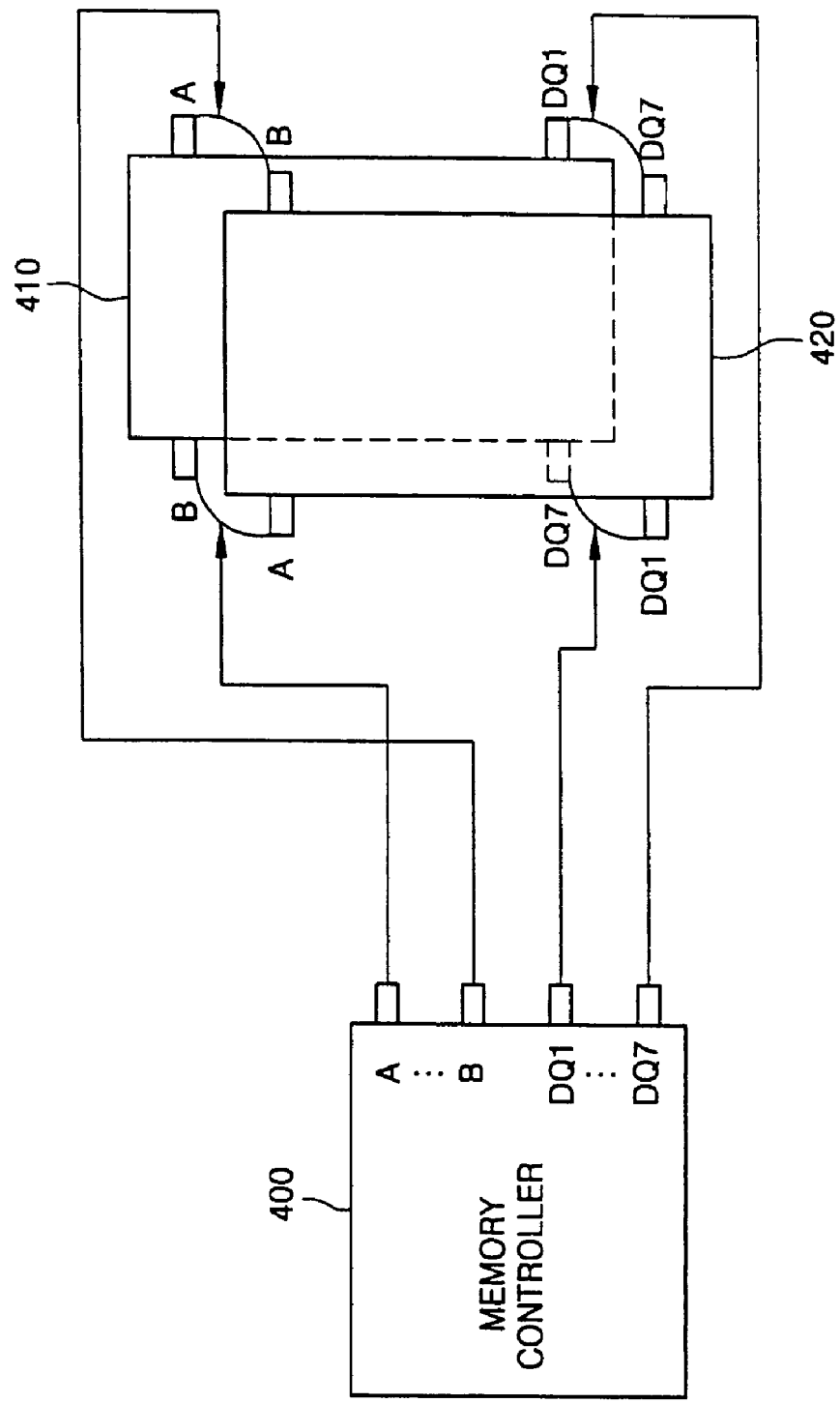
FIG. 3 is a schematic diagram illustrating a memory controller coupled to a normal package and to a mirrored package that are in a paired configuration according to the conventional art.
Figure 4:
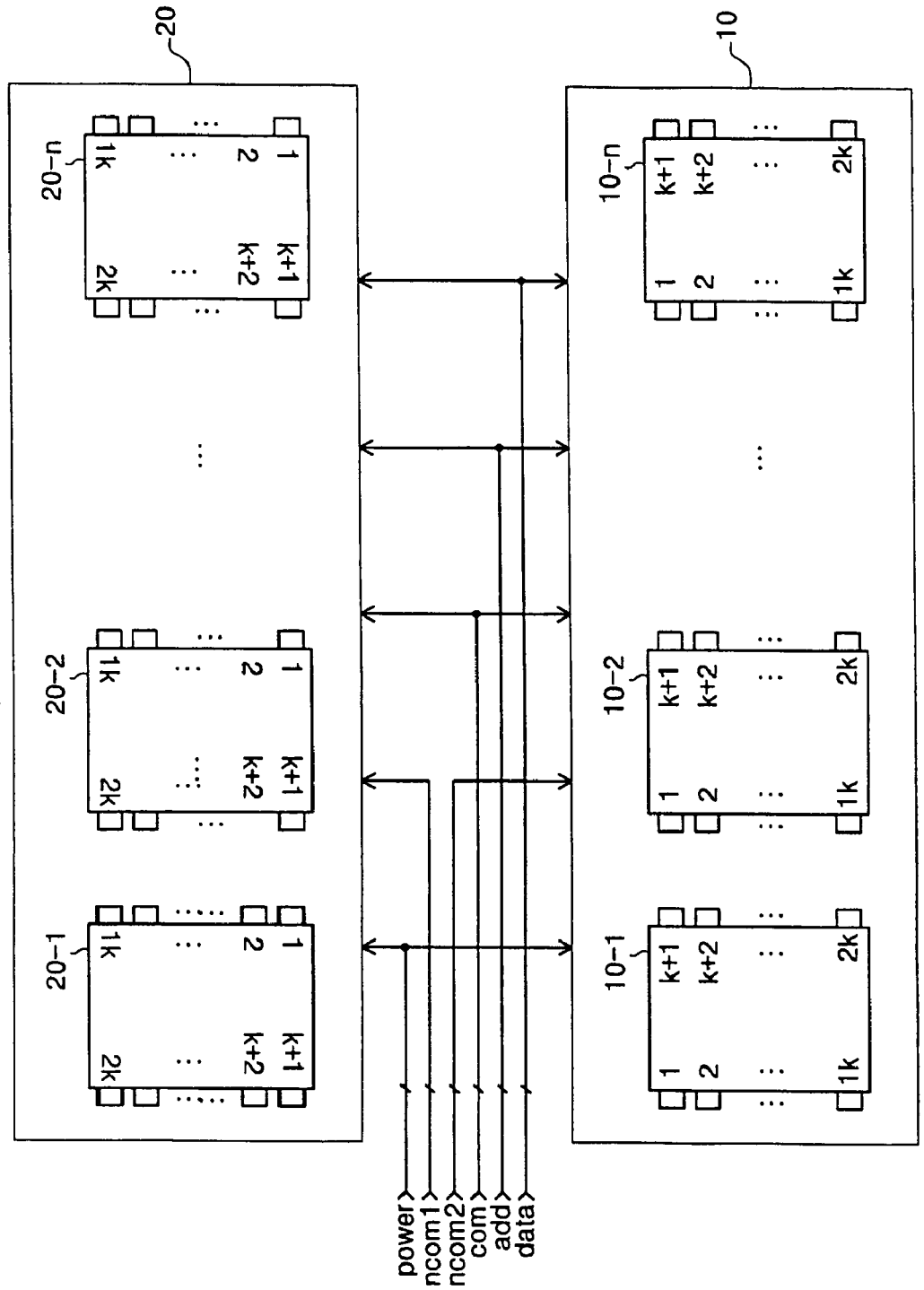
FIG. 4 is a schematic diagram illustrating the pin arrangement of a conventional DIMM having a number of memory devices mounted on the module board.
Figure 5:
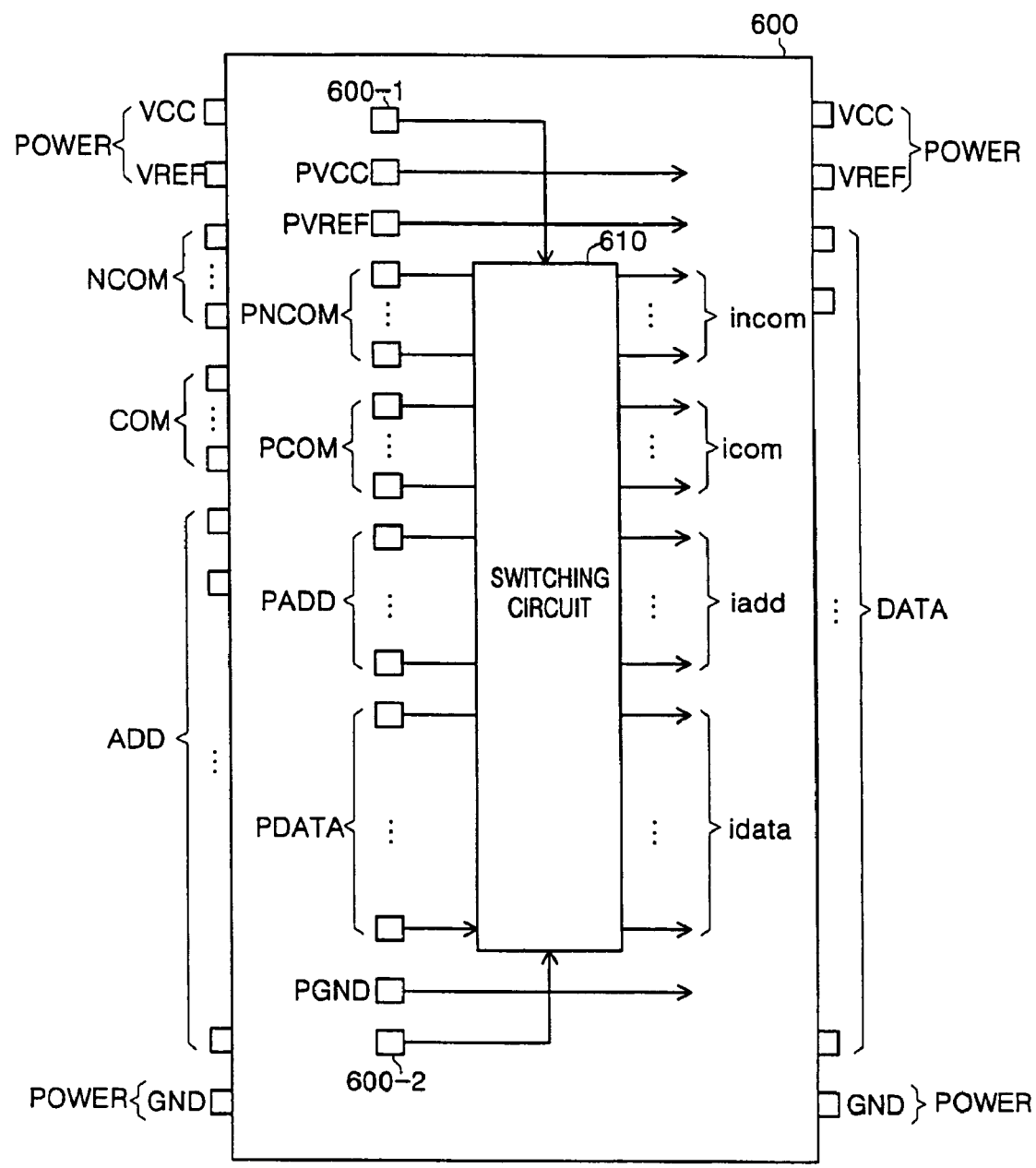
FIG. 5 is a schematic diagram illustrating a conventional memory device capable of a mirror mode function.

Compared to the conventional DIMM illustrated in FIG. 5, the DIMM illustrated in FIG. 6 commonly applies a reset signal (reset) from the memory controller (not shown) to the memory devices 30-1, . . . , 30-n on the front side 30 of the memory module and to the memory devices 40-1, . . . , 40-n on the rear side 40 of the memory module. Thus, the memory devices have an additional pin that is configured to receive the reset signal. The reset signal is used to initialize the memory devices 30-1, . . . 30-n, 40-1, . . . 40-n.

The memory devices 30-1, . . . , 30-n, 40-1, . . . , 40-n may include, for example, a number of high frequency DRAM devices that are compatible with the DDR3 DRAM. Before normal DRAM operations may be performed, the DDR3 DRAM devices are periodically initialized using the reset signal.

Figure 7:
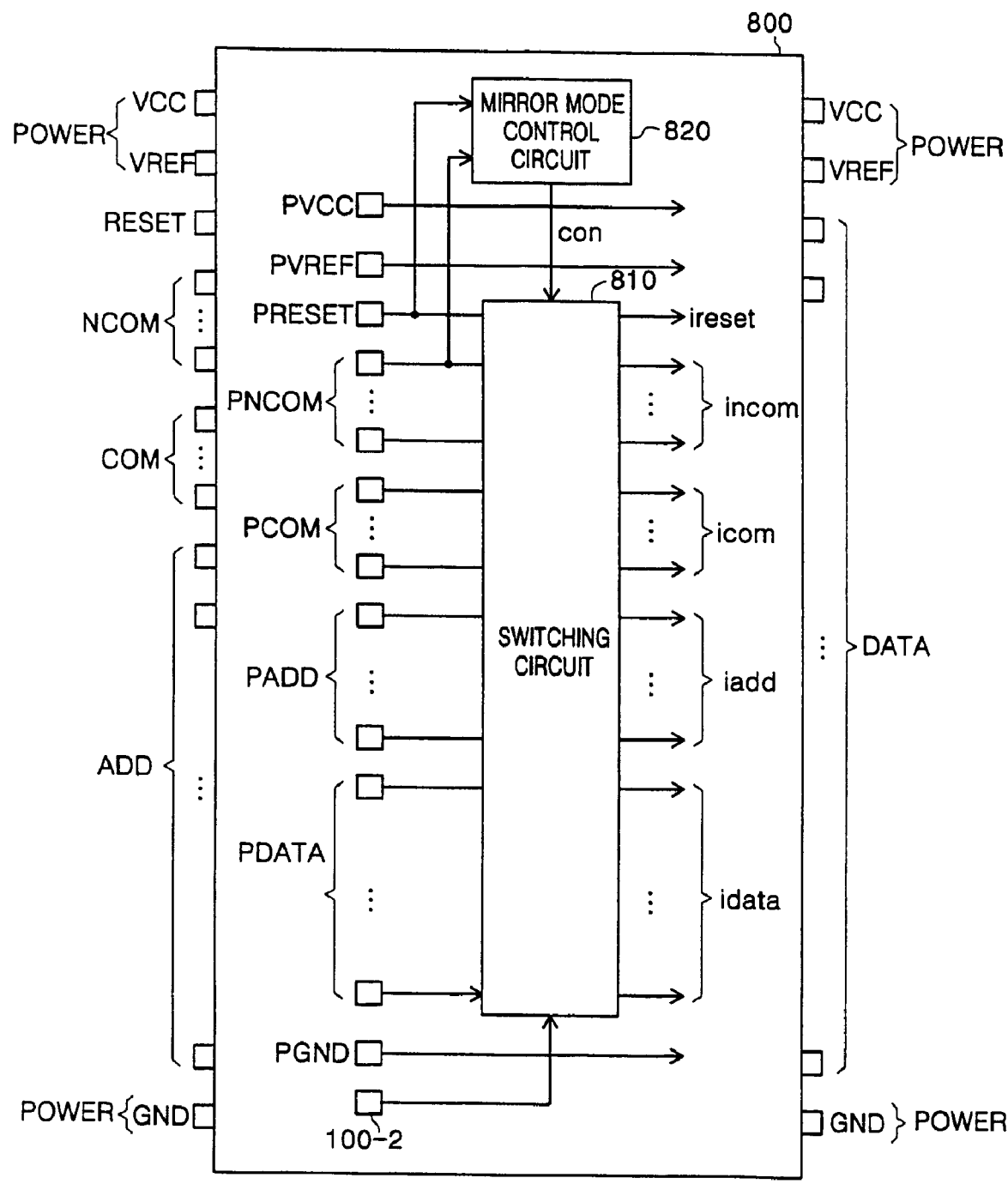
FIG. 7 is a schematic diagram illustrating a memory device capable of mirror mode function according to some embodiments of the invention.

FIG. 7 is a schematic diagram illustrating a memory device 800 capable of mirror mode function according to some embodiments of the invention. The memory device 800 may correspond to the individual memory devices 30-1, . . . , 30-n, 40-1, . . . , 40-n illustrated in FIG. 6.

The device 800 receives a number of external signals such as power signals (VCC, VREF, GND), non-shared command signals (NCOM), command signals (COM), address signals (ADD), and data signals (DATA) at external pins. The external signals mentioned above appear at corresponding pads PVCC, PVREF, PGND, PNCOM, PCOM, PADD, and PDATA. Furthermore, the memory device 800 also has a reset pin to receive an initializing signal (RESET) from a memory controller to a reset pad PRESET. The memory device 800 may be initialized in response to the reset signal (RESET), which typically operates at a relatively low frequency.

The memory device 800 includes a switching circuit 810, which has the capability of applying the externally applied signals to a variety of internal circuits. The switching circuit 810 is controlled by a mirror mode control circuit 820, which produces a mirror control signal (con) in response to the reset signal (RESET) and one of the non-shared command signals (NCOM). In alternative embodiments of the invention, the mirror mode control circuit 820 may be responsive to the reset signal (RESET) and more than one of the non-shared command signals (NCOM).

According to some embodiments of the invention, the memory device 800 may operate in mirror mode when the mirror control signal (con) is at a "high" level. In this case, the switching circuit 810 may transfer the input signals applied to the command and address pads (PNCOM, PCOM, and PADD) to a number of corresponding internal data signals (idata). The input signals of the data signal pads (PDATA) may be transferred to a number of corresponding internal command and address signals such as income, icom.

Conversely, when the control signal (con) is at a "low" level, the memory device 800 operates in a normal mode. In this case the switching circuit 810 applies the input signals of the command and address pads (PNCOM, PCOM, and PADD) to a number of corresponding internal command signals (income, icom) and internal address signals (iadd), and also applies the input signals of the data signal pads (PDATA) to a number of corresponding internal data signals (idata).

Alternatively, it should be apparent that the memory device may be operated in a mirror mode when the mirror control signal (con) is at a "low" level and in a normal mode when the control signal (con) is at a "high" level.

Compared to the conventional memory device illustrated in FIG. 5, the memory device 800 does not require additional bonding pads as well as additional pins for receiving a mirror mode control signal or a normal mode control signal. In other words, a high frequency memory device such as DDR3 DRAM has basically a reset signal for initializing a memory device irrespective of mirror mode operation. Therefore, memory devices according to embodiments of the invention may use the existing reset signal and another existing non-shared command signal to control the operation of the device in mirror mode and normal mode. As a result, the size of a memory device according to embodiments of the invention may be reduced compared to the conventional memory devices described above.

Furthermore, because the memory device 800 may be operated in mirror mode, a DIMM incorporating a number of memory devices 800, such as the DIMM illustrated in FIG. 6, may operate without reflections and signal degradation from short stubs.

Figure 8:
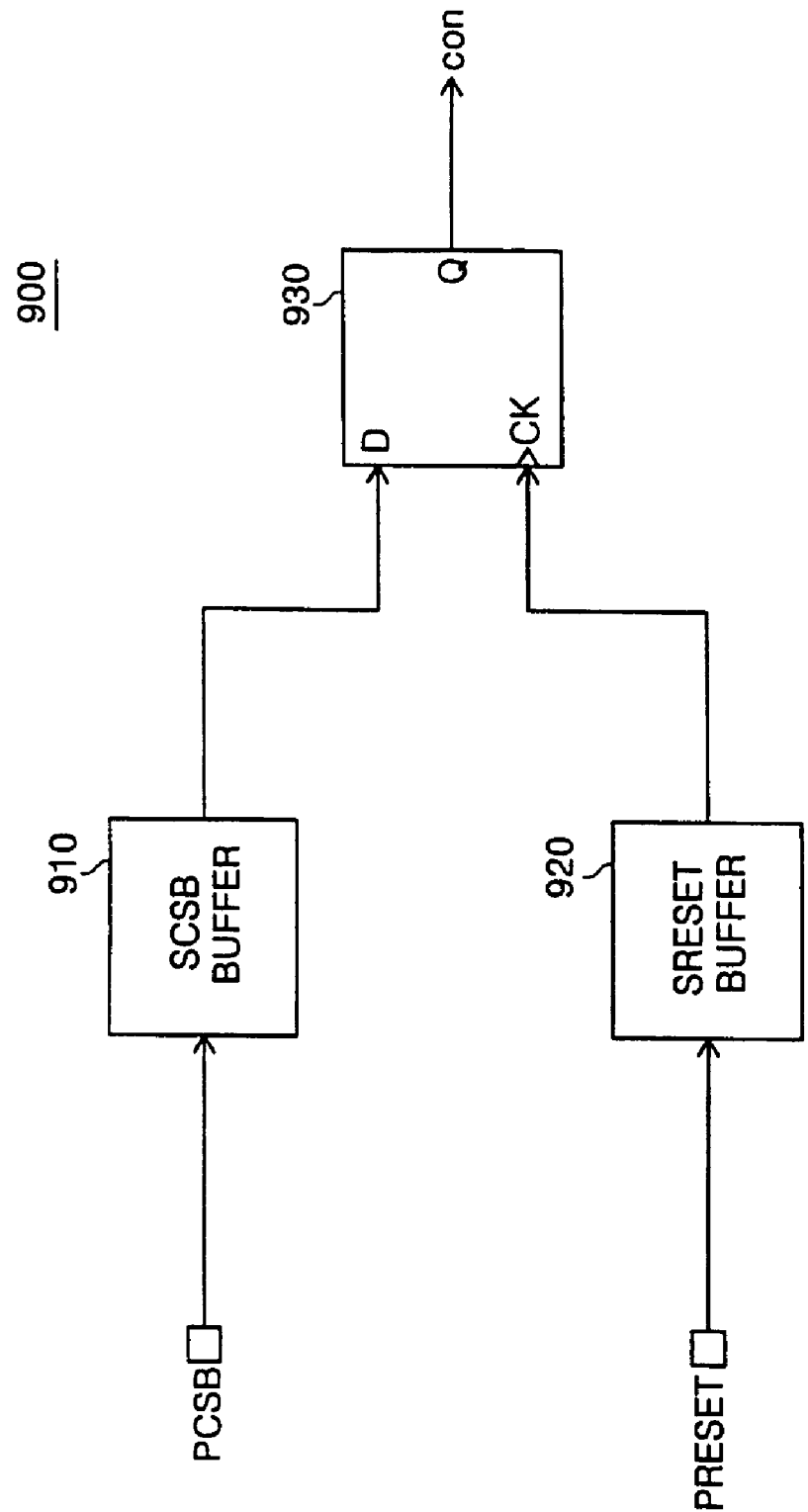
FIG. 8 is a schematic diagram illustrating a mirror mode control circuit according to some embodiments of the invention.

FIG. 8 is a schematic diagram illustrating a mirror mode control circuit 900 according to some embodiments of the invention. The mirror mode control circuit 900 generates a mirror control signal (con) in response to a reset signal input from a reset pad (PRESET) and in response to a chip select signal (CSB) input from a chip select pad (PCSB). The chip select signal (CSB) is an example of a non-shared command signal (NCOM), as illustrated in FIG. 7. The chip select signal (CSB) is input to a chip select buffer 910 that generates an internal chip select signal for a flip flop 930. The reset signal (RESET) is input to a reset buffer 920 that generates an internal reset signal for the flip flop 930. The flip flop 930 is latched to the internal chip select signal from the chip select buffer 910 and generates the mode control signal (con) in response to the internal reset signal generated by the reset buffer 920.

Figure 9:
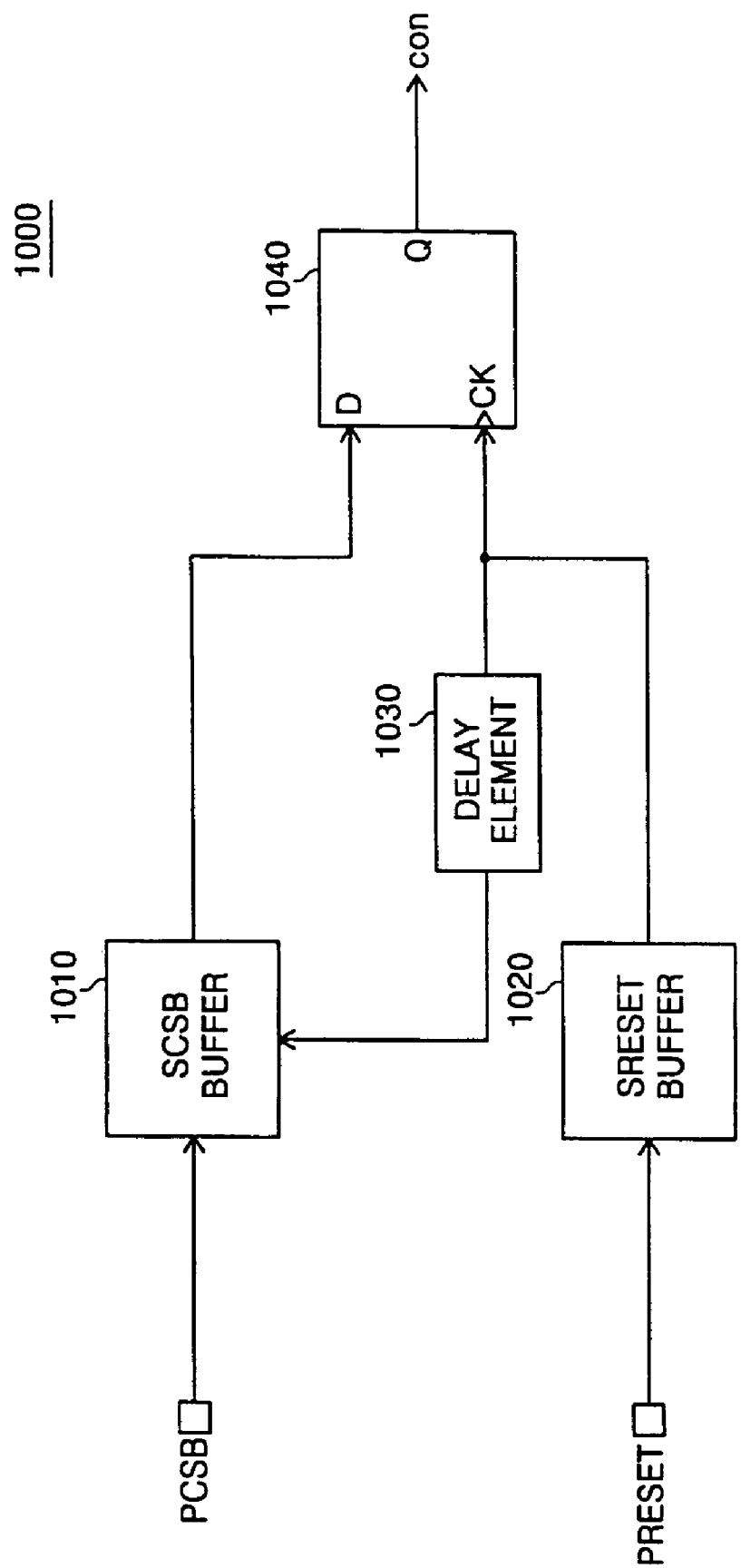
FIG. 9 is a schematic diagram illustrating a mirror mode control circuit according to other embodiments of the invention.

FIG. 9 is a schematic diagram illustrating a mirror mode control circuit 1000 according to other embodiments of the invention. The mirror mode control circuit 1000 generates a mirror control signal (con) in response to a reset signal input from a reset pad (PRESET) and in response to a chip select signal (CSB) input from a chip select pad (PCSB). The chip select signal (CSB) is an example of a non-shared command signal (NCOM), as illustrated in FIG. 7. The chip select signal (CSB) is input to a chip select buffer 1010 that generates an internal chip select signal for a flip flop 1040. The reset signal (RESET) is input to a reset buffer 1020 that generates an internal reset signal for the flip flop 1040. The flip flop 1040 is latched to the internal chip select signal from the chip select buffer 1010 and generates the mirror control signal (con) in response to the internal reset signal generated by the reset buffer 1020.

Additionally, the mirror control circuit 1000 includes a delay element 1030 that is configured to reduce a current flowing through the chip select buffer 1010. That is, the chip select buffer 1010 is enabled in response to an internal reset signal which is delayed by delay element 1030 and generates an internal chip select signal for the flip flop 1040.

Figure 10:
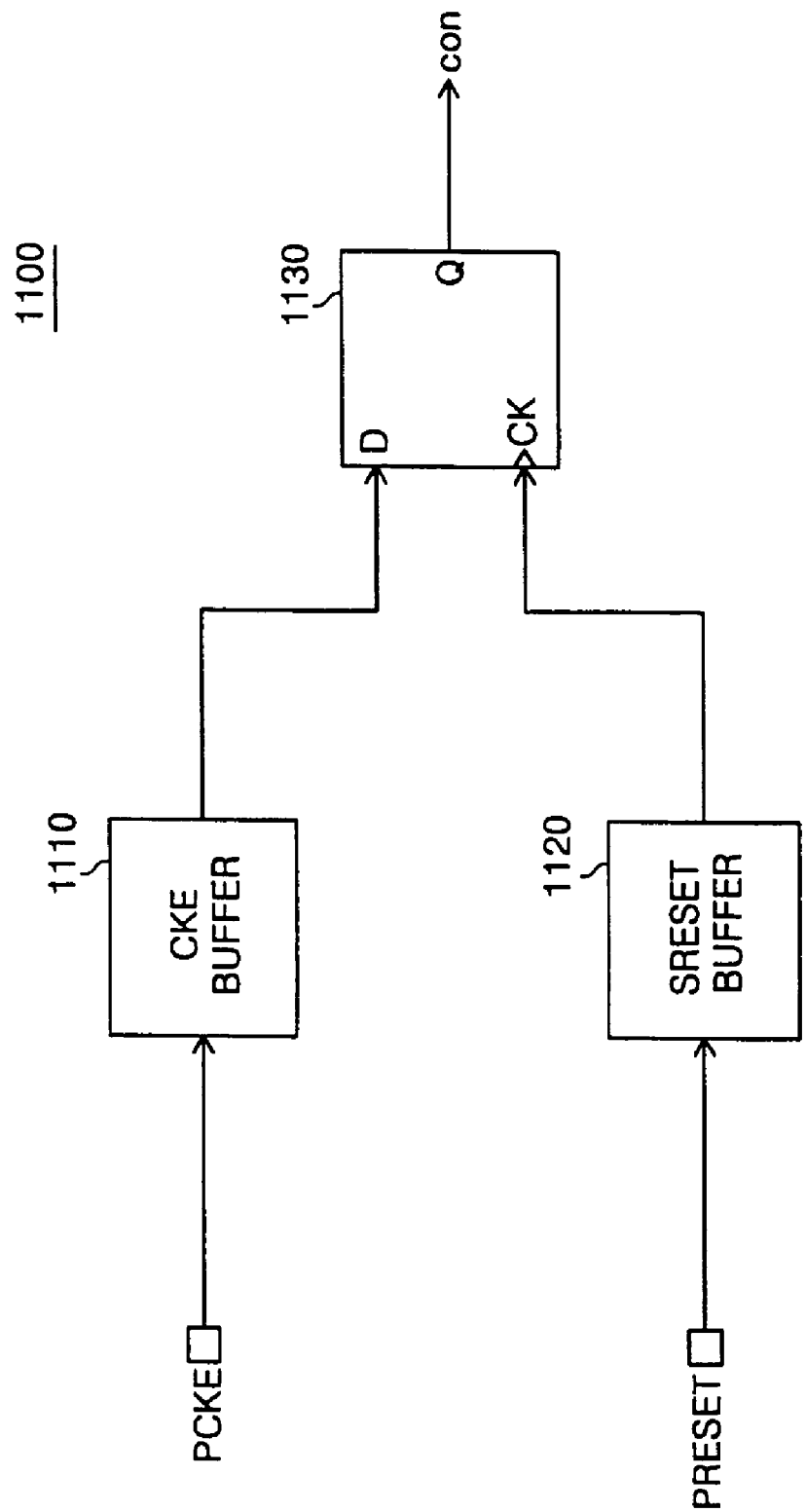
FIG. 10 is a schematic diagram illustrating a mirror mode control circuit according to still other embodiments of the invention.

FIG. 10 is a schematic diagram illustrating a mirror mode control circuit 1100 according to still other embodiments of the invention. The mirror mode control circuit 1100 generates a mirror control signal (con) in response to a reset signal input from a reset pad (PRESET) and in response to a clock enable signal (CKE) input from a clock enable pad (PCKE). The clock enable signal (CKE) is an example of a non-shared command signal (NCOM), as illustrated in FIG. 7. The clock enable signal (CKE) is input to a clock enable buffer 1110 that generates an internal clock enable signal for a flip flop 1130. The reset signal (RESET) is input to a reset buffer 1120 that generates an internal reset signal for the flip flop 1130. The flip flop 1130 is latched to the internal chip select signal from the clock enable buffer 1110 and generates the mode control signal (con) in response to the internal reset signal generated by the reset buffer 1120.

Although not shown in FIG. 10, in alternative embodiments the mirror mode control circuit 1100 may also include a delay element. In this case, the delay element may be connected to the mirror mode control circuit in the same manner as the delay element 1030 of FIG. 9.

Figure 11:
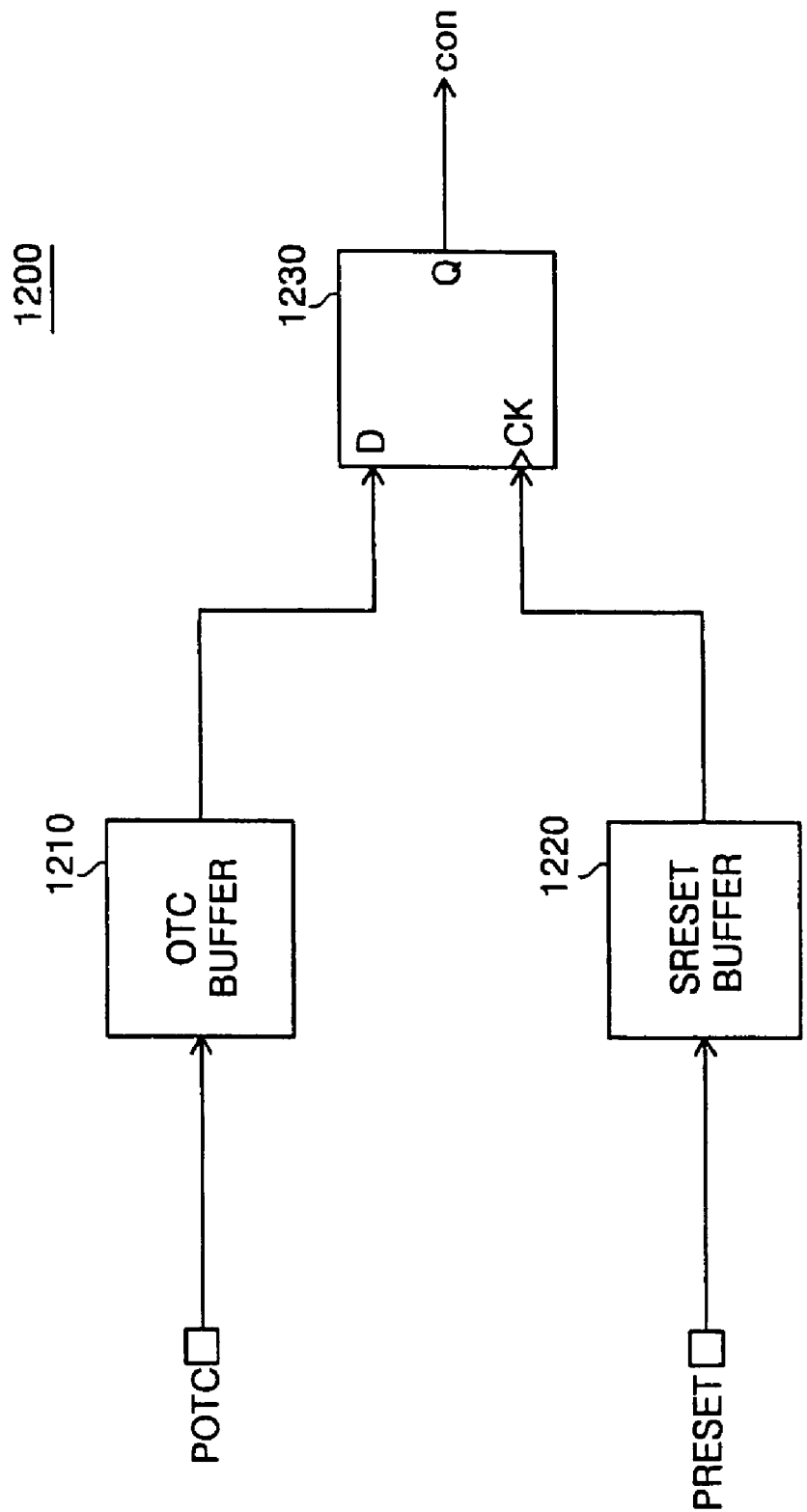
FIG. 11 is a schematic diagram illustrating a mirror mode control circuit according to some other embodiments of the invention.

FIG. 11 is a schematic diagram illustrating a mirror mode control circuit 1200 according to some other embodiments of the invention. The mirror mode control circuit 1200 generates a mirror control signal (con) in response to a reset signal input from a reset pad (PRESET) and in response to an on-die termination signal (OTC) input from an on-die termination pad (POTC). The on-die termination signal (OTC) is an example of a non-shared command signal (NCOM), as illustrated in FIG. 7. The on-die termination signal (OTC) is input to an on-die termination buffer 1210 that generates an internal on-die termination signal for a flip flop 1230. The reset signal (RESET) is input to a reset buffer 1220 that generates an internal reset signal for the flip flop 1230. The flip flop 1230 is latched to the internal on-die termination signal from the on-die termination buffer 1210 and generates the mirror control signal (con) in response to the internal reset signal generated by the reset buffer 1220.

Although not shown in FIG. 11, in alternative embodiments the mirror mode control circuit 1200 may also include a delay element. In this case, the delay element may be connected to the mirror mode control circuit in the same manner as the delay element 1030 of FIG. 9.

According to the embodiments of the invention illustrated in FIGS. 8-11, a mirror control circuit generates a control signal in response to a reset signal and a non-shared command signal that are transferred from a memory controller. As described above, the non-shared command signal may include a chip select signal (CSB), a clock enable signal (CKE), or an on-die termination signal (OTC).

Figure 12:
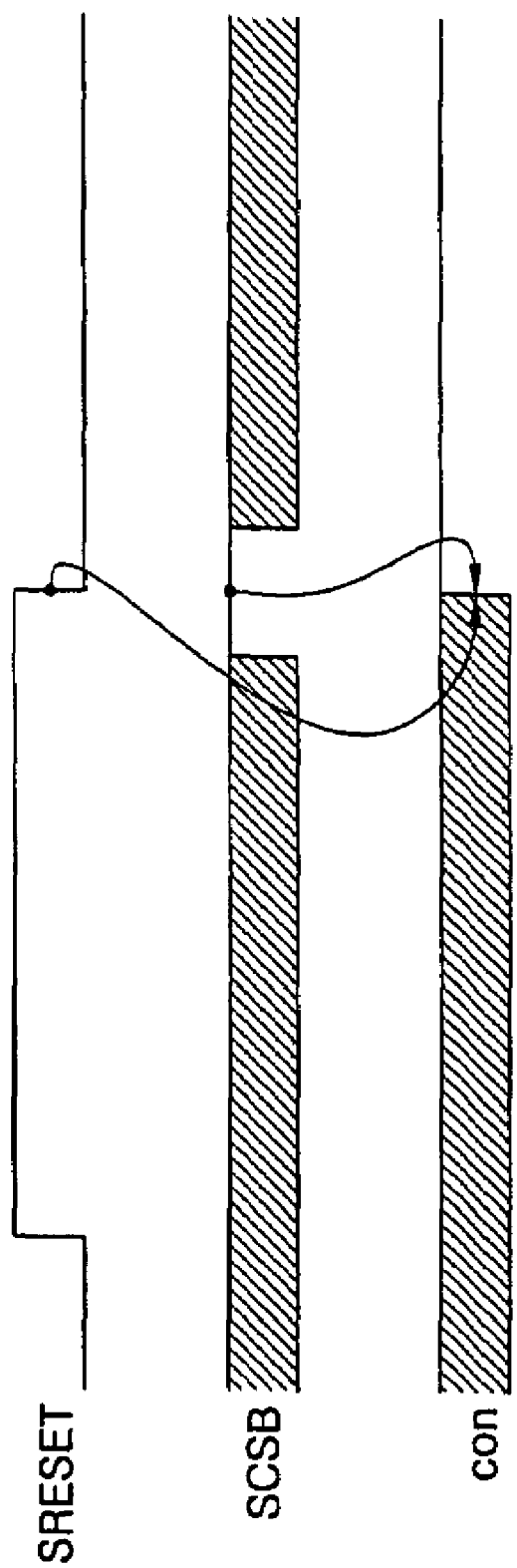
FIG. 12 is a timing diagram illustrating the signal levels that may trigger mirror mode operation in keeping with embodiments illustrated in FIGS. 9 and 10.

FIG. 12 is a timing diagram illustrating the signal levels that may trigger mirror mode operation in keeping with embodiments illustrated in FIGS. 8 and 9. When the mirror control signal (con) has a "high" level, the memory device operates in a mirror mode. The mirror control signal (con) transitions to a "high" level in response to the buffered chip select signal (SCSB) at a "high" level and a falling edge of the buffered reset signal (SRESET). The embodiments of FIGS. 10 and 11 may have similar timing diagrams except for the fact that the buffered chip select signal (SCSB) is replaced by another non-shared command signal, i.e., a buffered clock enable signal (SCKE) or a buffered on-die termination signal (SOTC).

Figure 13:
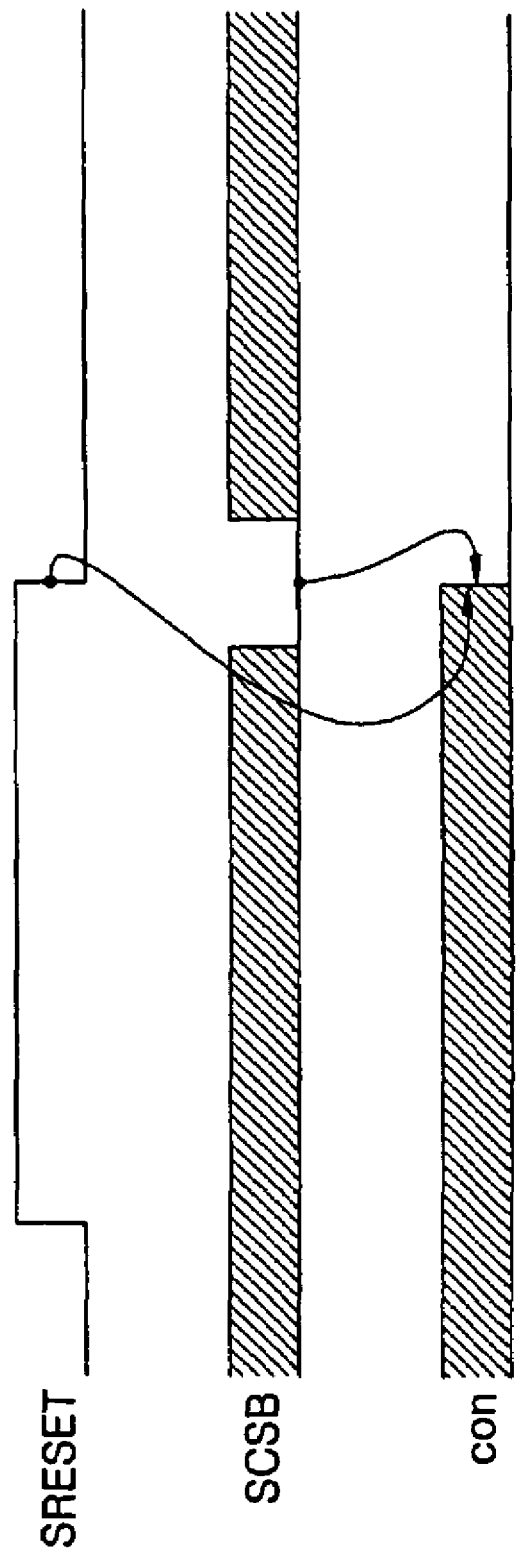
FIG. 13 is a timing diagram illustrating the signal levels that may trigger normal mode operation in keeping with embodiments illustrated in FIGS. 9 and 10.

FIG. 13 is a timing diagram illustrating the signal levels that may trigger normal mode operation in keeping with embodiments illustrated in FIGS. 8 and 9. When the mirror control signal (con) has a "low" level, the memory device operates in a normal mode. The mirror control signal (con) has a "low" level in response to the buffered chip select signal (SCSB) at a "low" level and in response to a falling edge of the buffered reset signal (SRESET). The embodiments of FIGS.

10 and 11 may have similar timing diagrams except for the fact that the buffered chip select signal (SCSB) is replaced by another non-shared command signal, i.e., a buffered clock enable signal (SCKE) or a buffered on-die termination signal (SOTC).

Figure 14:
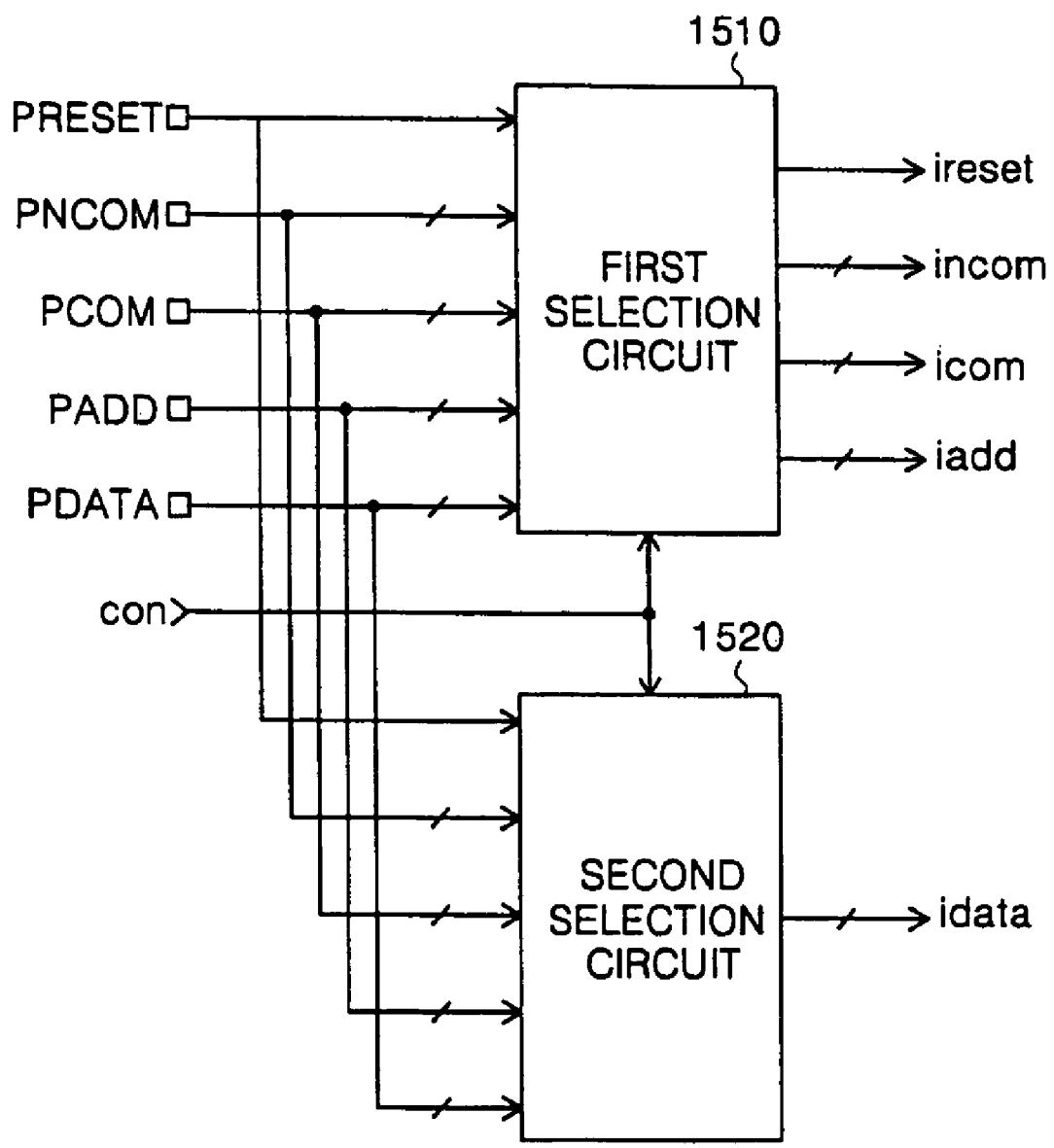
FIG. 14 is a schematic diagram illustrating a switching circuit according to some embodiments of the invention.

FIG. 14 is a schematic diagram illustrating a switching circuit 1500 according to some embodiments of the invention. The switching circuit 1500 is suitable for use as, for example, the switching circuit 810 of FIG. 7.

The switching circuit 1500 includes a first selection circuit 1510 and a second selection circuit 1520. All the external signals (RESET, NCOM, COM, ADD, DATA) shown in FIG. 7 are applied to each of the first and second selection circuits 1510, 1520. The mirror control signal (con) from the mirror mode control circuit (not shown) is also applied to each of the first and second selection circuits 1510, 1520.

Depending on the logic state of the mirror control signal (con), the first and second selection circuits 1510, 1520 operate in mirror mode or normal mode. In mirror mode, the external signals from the pads PRESET, PNCOM, PCOM, and PADD are applied to a corresponding number of internal data signals (idata). Similarly, the external signals from the pads PDATA are applied to a corresponding number of internal command and address signals (ireset, incom, icom, iadd).

When operating in normal mode, the memory device passes the external signals directly to the corresponding internal circuit without re-assignment. For example, the external data signals from the PDATA pads are assigned to a corresponding number of internal data signals (idata). Similarly, the external address and command signals from the PRESET, PNCOM, PCOM, PADD, and PDATA pads are assigned to a corresponding number of internal command and address signals (ireset, income, icom, iadd).

The invention may be practiced in many ways. What follows are exemplary, non-limiting descriptions of some embodiments of the invention.

According to some embodiments of the invention, a system includes a memory module; the memory module having a first memory device, a second memory device, and a module board; and a memory controller, the first memory device structured to operate in a mirror mode or a normal mode in response to a first shared signal and a first non-shared signal received from the memory controller through a first shared signal line and a first non-shared signal line, respectively, the second memory device structured to operate in the mirror mode or the normal mode in response to the first shared signal and a second non-shared signal received from the memory controller through the first shared signal line and a second non-shared signal line, respectively.

According to some embodiments of the invention, the first shared signal is a chip reset signal.

According to some embodiments of the invention, the first non-shared signal and the second non-shared signal are chip select signals.

According to some embodiments of the invention, the first non-shared signal and the second non-shared signal are clock enable signals.

According to some embodiments of the invention, the first non-shared signal and the second non-shared signal are on-die termination signals.

According to some embodiments of the invention, the memory module includes a DIMM with the first memory device arranged on a front side of the module board in a position that corresponds with the second memory device that is arranged on a rear side of the module board.

According to some embodiments of the invention, the first memory device includes a first control circuit structured to generate a first control signal in response to the first shared signal and the first non-shared signal; and a first switching circuit structured to route a second shared signal that is input to the first memory device to a selected internal circuit of the first memory device in response to the first control signal.

According to some embodiments of the invention, the second memory device includes a second control circuit structured to generate a second control signal in response to the first shared signal and the second non-shared signal; and a second switching circuit structured to route the second shared signal that is input to the second memory device to a selected internal circuit of the second memory device in response to the second control signal.

According to other embodiments of the invention, a semiconductor memory device includes a control circuit structured to generate a control signal in response to a first command signal and a second command signal; and a switching circuit structured to route an input of the semiconductor memory device to a selected internal circuit in response to the control signal.

According to some embodiments of the invention, the control circuit includes a first buffer structured to generate a first internal signal in response to the first command signal; a second buffer structured to generate a second internal signal in response to the second command signal; and a flip flop structured to generate the control signal in response to the first internal signal and the second internal signal.

According to some embodiments, the control circuit further includes a delay element coupled between the first buffer and the flip-flop and between the second buffer and the first buffer, the delay element structured to reduce a current flowing through the first buffer.

According to some embodiments, the first command signal includes a chip select signal from a memory controller and the second command signal includes a chip reset signal from the memory controller.

According to some embodiments, the first command signal includes a clock enable signal from a memory controller and the second command signal includes a chip reset signal from the memory controller.

According to some embodiments, the first command signal includes an on-die termination signal from a memory controller and the second command signal includes a chip reset signal from the memory controller.

According to some embodiments, the switching circuit includes a first switching element structured to route the input to a first internal circuit in response to the control signal; and a second switching element structured to route the input to a second internal circuit in response to the control signal.

According to still other embodiments of the invention, a method includes operating a first memory device in a normal mode in response to a shared signal and a first non-shared signal that are inputs to the first memory device; and with respect to the first memory device, operating a second memory device in a mirror mode in response to the shared signal and a second non-shared signal that are inputs to the second memory device.

According to some embodiments, operating the first memory device includes generating a first internal signal in response to the shared signal and the first non-shared signal, the first internal signal configured to control a first switching circuit that routes an input of the first memory device to one of at least two outputs of the first memory device.

According to some embodiments, operating the second memory device includes generating a second internal signal in response to the shared signal and the second non-shared signal, the second internal signal configured to control a second switching circuit that routes an input of the second memory device to one of at least two outputs of the second memory device.

According to some embodiments, the shared signal includes a chip reset signal that is received from a memory controller.

According to some embodiments, the first non-shared signal and the second non-shared signal are selected from the group comprising a chip select signal, a clock enable signal, and an on-die termination signal.

Although the principles of the invention were described and illustrated above in numerous exemplary embodiments, it should be apparent that the invention is not limited only to the specific embodiments that were described. Rather, the exemplary embodiments may be modified in arrangement and detail without departing from the inventive principles. We claim all modifications and variations falling within the spirit and scope of the following claims.

The invention claimed is:

1. A system comprising:
   a memory module, the memory module including a first memory device, a second memory device, and a module board; and
   a memory controller, the first memory device structured to operate in a normal mode in response to a first shared signal and a first non-shared signal received from the memory controller, the second memory device structured to operate in a mirror mode in response to the first shared signal and a second non-shared signal received from the memory controller.

2. The system of claim 1, wherein the first shared signal is a chip reset signal and the memory controller is structured to transmit the chip reset signal to the first memory device and the second memory device, and wherein the chip reset signal commonly initializes the first memory device and the second memory device.

3. The system of claim 1, wherein the first non-shared signal and the second non-shared signal are at least one of a chip select signal, a clock enable signal, and an on-die termination signal, and wherein the memory controller is structured to transmit the first non-shared signal to the first memory device, and the memory controller is structured to transmit the second non-shared signal to the second memory device.

4. The system of claim 1, further comprising a second shared signal structured to provide common power to the first memory device and the second memory device.

5. The system of claim 1, further comprising a third shared signal structured to provide at least one of a command signal, an address signal, and a data signal to the first memory device and the second memory device.

6. The system of claim 1, wherein the memory module comprises a DIMM with the first memory device arranged on a front side of the module board in a position that corresponds with the second memory device that is arranged on a rear side of the module board.

7. A system comprising:
   a module board;
   a first plurality of memory devices coupled to a front side of the module board;
   a second plurality of memory devices coupled to a back side of the module board; and
   a memory controller, the first plurality of memory devices structured to operate in a normal mode responsive to a shared signal and a first non-shared signal received from the memory controller, the second plurality of memory devices structured to operate in a mirror mode responsive to the shared signal and a second non-shared signal received from the memory controller, wherein the memory controller is structured to transmit the shared signal to the first plurality of memory devices and the second plurality of memory devices,
   wherein each of the first plurality of memory devices includes:
      a first mirror control circuit structured to generate a first mirror control signal having a first level responsive to the shared signal and the first non-shared signal; and
      a first switching circuit structured to route a plurality of external data signals to a plurality of internal signals, and to route a plurality of external address and command signals to a plurality of internal address and command signals responsive to the first mirror control signal.

8. The system of claim 7,
   wherein each of the second plurality of memory devices includes:
      a second mirror control circuit structured to generate a second mirror control signal having a second level responsive to the shred signal and the second non-shared signal; and
      a second switching circuit structured to route the plurality of external address and command signals to the plurality of internal data signals, and to route the plurality of external data signals to the plurality of internal address and command signals responsive to the second mirror control signal.

9. A semiconductor memory device comprising:
   a mirror control circuit structured to generate a mirror control signal in response to a first command signal and a second command signal; and
   a switching circuit structured to route first input signals applied to first pins of the semiconductor memory device to first internal signals corresponding to the first pins and to route second input signals applied to second pins of the semiconductor memory device to second internal signals corresponding to the second pins in a normal mode in response to a first level of the mirror control signal, and to route the first input signals to the second internal signals and to route the second input signals to the first internal signals in a mirror mode in response to a second level of the mirror control signal, wherein the first pins and the second pins are arranged symmetrically,
   wherein the first command signal comprises one of a chip select signal, a clock enable signal, and an on-die termination signal, the second command signal comprises a chip reset signal, and the semiconductor memory device is initialized in response to the chip reset signal.

10. The semiconductor memory device of claim 9, the mirror control circuit comprising:
    a first buffer structured to generate a first internal command signal in response to the first command signal;
    a second buffer structured to generate a second internal command signal in response to the second command signal; and
    a flip flop structured to latch the first internal command signal and generate the mirror control signal in response to the first internal command signal and the second internal command signal.

11. The semiconductor memory device of claim 10, the mirror control circuit further comprising a delay element coupled to a first conductor and a second conductor, the first conductor coupling the delay element to the first buffer, and the second conductor coupling the delay element to the flip-flop and the second buffer, the delay element structured to reduce a current flowing through the first buffer.

12. The semiconductor memory device of claim 10, wherein the first command signal comprises the chip select signal from a memory controller and the second command signal comprises the chip reset signal from the memory controller, and wherein the mirror control signal is set to a high level to indicate a memory mirror mode responsive to (a) a high level of the chip select signal and (b) a transition of the chip reset signal from the high level to a low level.

13. The semiconductor memory device of claim 10, wherein the first command signal comprises the clock enable signal from a memory controller and the second command signal comprises the chip reset signal from the memory controller, and wherein the mirror control signal is set to a high level to indicate a memory mirror mode responsive to (a) a high level of the clock enable signal and (b) a transition of the chip reset signal from the high level to a low level.

14. The semiconductor memory device of claim 10, wherein the first command signal comprises the on-die termination signal from a memory controller and the second command signal comprises the chip reset signal from the memory controller, and wherein the mirror control signal is set to a high level to indicate a memory mirror mode responsive to (a) a high level of the on-die termination signal and (b) a transition of the chip reset signal from the high level to a low level.

15. The semiconductor memory device of claim 9, the switching circuit comprising:
   a first switching element structured to route the first input signals and the second input signals to a first internal circuit and a second internal circuit respectively in response to the first level of the mirror control signal; and
   a second switching element structured to route the first input signals and the second input signals to the second internal circuit and the first internal circuit respectively in response to the second level of the mirror control signal.

16. A method comprising:
   operating a first memory device in a normal mode in response to a shared signal and a first non-shared signal that are inputs to the first memory device mounted on the front side of a module board; and
   with respect to the first memory device, operating a second memory device in a mirror mode in response to the shared signal and a second non-shared signal that are inputs to the second memory device mounted on the rear side of the module board.

17. The method of claim 16, wherein operating the first memory device comprises generating a first internal mirror signal in response to the shared signal and the first non-shared signal, the first internal mirror signal configured to control a first switching circuit that routes an input signal of the first memory device to one of at least two output terminals of the first memory device.

18. The method of claim 17, wherein operating the second memory device comprises generating a second internal mirror signal in response to the shared signal and the second non-shared signal, the second internal signal configured to control a second switching circuit that routes an input signal of the second memory device to one of at least two output terminals of the second memory device.

19. The method of claim 16, wherein the shared signal comprises a chip reset signal that is received from a memory controller.

20. The method of claim 16, wherein the first non-shared signal and the second non-shared signal are selected from at least one of a chip select signal, a clock enable signal, and an on-die termination signal.

* * * * *

UNITED STATES PATENT AND TRADEMARK OFFICE
CERTIFICATE OF CORRECTION

PATENT NO. : 7,539,826 B2
APPLICATION NO. : 11/117804
DATED : May 26, 2009
INVENTOR(S) : Moo-Sung Chae et al.

Page 1 of 1

It is certified that error appears in the above-identified patent and that said Letters Patent is hereby corrected as shown below:

Column 2, line 34, the word "(corn)" should read -- (com) --;
Column 2, line 42, the word "corn" should read -- com --;
Column 10, line 22, the word "shred" should read -- shared --.

Signed and Sealed this

Twenty-seventh Day of October, 2009

David J. Kappos
*Director of the United States Patent and Trademark Office*